United States Patent
Sugita et al.

(10) Patent No.: US 7,167,387 B2
(45) Date of Patent: Jan. 23, 2007

(54) VARIABLE RESISTANCE ELEMENT, METHOD OF MANUFACTURING THE ELEMENT, MEMORY CONTAINING THE ELEMENT, AND METHOD OF DRIVING THE MEMORY

(75) Inventors: Yasunari Sugita, Osaka (JP); Akihiro Odagawa, Osaka (JP); Hideaki Adachi, Osaka (JP); Satoshi Yotsuhashi, Hyogo (JP); Tsutomu Kanno, Osaka (JP); Kiyoshi Ohnaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 21 days.

(21) Appl. No.: 11/061,920

(22) Filed: Feb. 22, 2005

(65) Prior Publication Data

US 2005/0167699 A1    Aug. 4, 2005

Related U.S. Application Data

(63) Continuation of application No. PCT/JP04/15728, filed on Oct. 22, 2004.

(30) Foreign Application Priority Data

Oct. 23, 2003   (JP)   ............... 2003-363063

(51) Int. Cl.
   *G11C 11/00*    (2006.01)
(52) U.S. Cl. .................. 365/148; 257/37; 257/E21.009
(58) Field of Classification Search ................ 365/148; 257/37, E21.009
   See application file for complete search history.

(56) References Cited

U.S. PATENT DOCUMENTS 6,204,139 B1    3/2001   Liu et al.
6,262,129 B1    7/2001   Murray et al.
6,473,332 B1   10/2002   Ignatiev et al.
6,565,763 B1    5/2003   Asakawa et al.

(Continued)

FOREIGN PATENT DOCUMENTS

JP          09-045780          2/1997

(Continued)

OTHER PUBLICATIONS

Park, M. et al., "Block Copolymer Lithography: Periodic Arrays of —1011 Holes in 1 Square Centimeter" SCIENCE, vol. 276, May 30, 1997.

(Continued)

*Primary Examiner*—Hoai V. Ho
(74) *Attorney, Agent, or Firm*—McDermott Will & Emery LLP (57) ABSTRACT

The present invention lowers a drive voltage of a RRAM, which is a promising low power consumption, high-speed memory and suppresses variations in the width of an electric pulse for realizing a same resistance change. The present invention provides a variable resistance element including: a first electrode; a layer in which its resistance is variable by applying an electric pulse thereto, the layer being formed on the first electrode; and a second electrode formed on the layer; wherein the layer has a perovskite structure; and the layer has at least one selected from depressions and protrusions in an interface with at least one electrode selected from the first electrode and the second electrode.

11 Claims, 10 Drawing Sheets

U.S. PATENT DOCUMENTS

| | | | |
|---|---|---|---|
| 6,831,872 B1 * | 12/2004 | Matsuoka | 365/210 |
| 6,841,833 B1 * | 1/2005 | Hsu et al. | 257/379 |
| 7,016,222 B1 * | 3/2006 | Morikawa | 365/158 |
| 2003/0003674 A1 | 1/2003 | Hsu et al. | |
| 2003/0081446 A1 | 5/2003 | Fricke et al. | |

FOREIGN PATENT DOCUMENTS

| | | |
|---|---|---|
| JP | 11-066654 | 3/1999 |
| JP | 11-121624 | 4/1999 |
| JP | 2000-54012 | 2/2000 |
| JP | 2001-151834 | 6/2001 |
| JP | 2003-068854 | 3/2003 |
| JP | 2003-068984 | 3/2003 |
| JP | 2003-188349 | 7/2003 |

OTHER PUBLICATIONS

Zhuang, W. W. et al., "Novell Colossal Magnetoresistive Thin Film Novolatile Resistance Random Access Memory (RRAM)", International Electron Devices Meeting, pp. 193-196.

* cited by examiner

VARIABLE RESISTANCE ELEMENT, METHOD OF MANUFACTURING THE ELEMENT, MEMORY CONTAINING THE ELEMENT, AND METHOD OF DRIVING THE MEMORY

This application is a continuation of PCT/JP04/15728, filed on Oct. 22, 2004.

TECHNICAL FIELD

The present invention relates to a variable resistance element usable as a non-volatile memory, a switching element, a rectifier element, or the like. This element is particularly useful as a variable resistance memory element for a storage device used in computers, mobile information terminals, or the like.

BACKGROUND ART

Memories that support reconfigurable logic LSIs have been demanded as computers become more diversified and faster. As such memories, non-volatile memories are desirable, not volatile memories such as DRAM (Dynamic Random Access Memory). At present, EEPROMs (Electronically Erasable and Programmable Read Only Memories), flash memories, and the like are used as non-volatile memories. Yet, there is a need for a fast, large-capacity, low power consumption memory that supports recording and reproducing with a higher degree of freedom, and the development of new memories such as FeRAMs (Ferroelectric Random Access Memories) and MRAMs (Magnetoresistive Random Access Memories) has been actively pursued. As one type of such new memories, RRAMs (Resistance Random Access Memories) have been expected to be a promising low-power consumption, high-speed memory.

The RRAM is a non-volatile memory that uses a CMR (Colossal Magnetoresistance) thin film as a storage element and performs recording and reproducing of information utilizing an electric resistance change in the CMR film caused by applying a pulse voltage to the CMR film (see, for example, U.S. Pat. Nos. 6,204,139 and 6,473,332).

RRAMs have the following two major problems. One is that the applied voltage (drive voltage) is high. Under the current state of the art, the voltage of electric pulse to be applied is about 5 V. However, reduction in the voltage is essential to increase the device speed and lower the power consumption. Another is large variations in the resistance of the thin film after the electric pulse application, in other words, large variations in the pulse width (duration) of the electric pulse required to achieve a given resistance change. In particular, variations in the pulse width are large when a polycrystalline film is used as the CMR thin film.

DISCLOSURE OF THE INVENTION

It is an object of the invention to improve a variable resistance element containing a layer the resistance value of which can be changed by the application of an electric pulse thereto.

The present invention provides a variable resistance element including: a first electrode, a layer in which its resistance is variable by applying an electric pulse thereto, the layer being formed on the first electrode, and a second electrode formed on the layer; wherein: the layer has a perovskite structure; and the layer has at least one selected from depressions and protrusions in an interface with at least one electrode selected from the first electrode and the second electrode.

The present invention also provides a method of manufacturing the foregoing variable resistance element. This method includes the steps of forming the layer on a surface of the first electrode, and forming the second electrode on a surface of the layer; and further includes at least one step selected from the steps of: forming at least one selected from depressions and protrusions in the surface of the first electrode; and forming at least one selected from depressions and protrusions in the surface of the layer.

The present invention further provides a non-volatile memory including the foregoing resistance element. This non-volatile memory includes the foregoing variable resistance element, and a diode or a transistor electrically connected to this variable resistance element.

The present invention still further provides a method of driving the foregoing non-volatile memory. This method includes the steps of changing a resistance state of the layer from a low resistance state to a high resistance state or vice versa by applying a write electric pulse across the first electrode and the second electrode; and identifying the resistance state of the layer by applying, across the first electrode and the second electrode, a read electric pulse that does not change the resistance state of the layer and is capable of reading out the resistance state. In this driving method, the resistance state of the layer may be changed by applying an electric pulse with a voltage of 4.0 V or lower.

In a variable resistance element of the present invention, depressions and/or protrusions are formed on a surface of a layer whose resistance value is variable by applying an electric pulse thereto (which hereinafter may also be referred to as an "information storage layer"), and therefore, in the vicinity of the depressions and/or protrusions, a local state change of the layer that originates from the application of the electric pulse is easily induced. This local state change propagates to the other portions of the information storage layer, and as a result, the resistance state of the layer as a whole can be changed with a pulse that is at a lower voltage than was conventional. Moreover, it becomes possible to suppress variations in the electric pulse width for changing the resistance state of this layer by the depressions and/or protrusions that trigger the state change of the information storage layer.

BEST MODE FOR CARRYING OUT THE INVENTION

Hereinbelow, preferred embodiments of a variable resistance element of the present invention are described with reference to the drawings.

Figure 1:
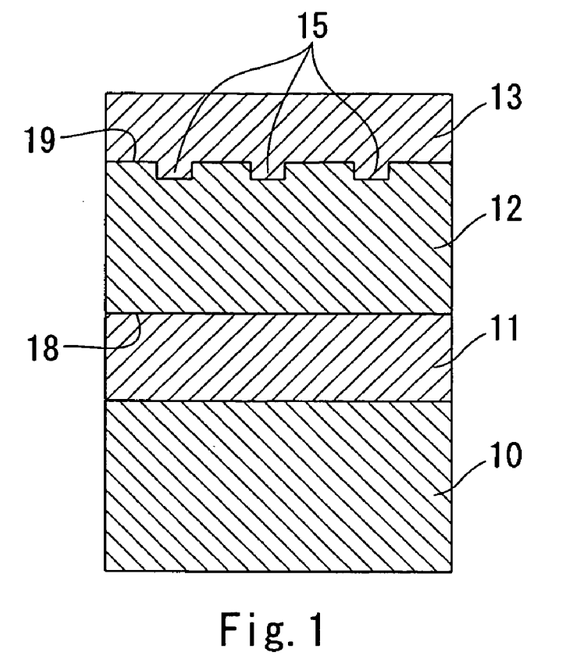
FIG. 1 is a cross-sectional view illustrating one example of a variable resistance element according to the present invention.

FIG. 1 shows one example of a variable resistance element of the present invention. In this element, a lower electrode 11, an information storage layer 12, an upper electrode 13 are formed on a substrate 10 in that order, and depressions 15 are formed in an interface 19 between the information storage layer 12 and the upper electrode 13. It should be noted that the "perovskite structure" may be a layered perovskite structure.

The information storage layer 12 is preferably an oxide containing at least one selected from manganese, cobalt, titanium, nickel, chromium, vanadium, and copper; for example, it is recommended that it contain at least one selected from $Pr_{1-x}Ca_xMnO_3$ (hereafter abbreviated as "PCMO"; the oxides mentioned below may also be represented by like abbreviations), $La_{1-x}Sr_xMnO_3$ (LSMO), $La_{1-x}Ca_xMnO_3$ (LCMO), and $LaCoO_3$. Here, x is a numerical value satisfying $0<x<1$, and with LSMO, x is preferably $0<x\leq0.5$.

The information storage layer 12 may be made of either a single-crystal substance or a polycrystalline substance. Generally, single-crystal substances are superior in characteristics, while polycrystalline substances are suitable for mass production. This layer may be composed of a layered material of oxides having different perovskite structures from each other.

The forming method of the information storage layer 12 is not restricted, and various physical or chemical methods may be employed, such as represented by sputtering, vapor deposition, CVD (Chemical Vapor Deposition), and MOCVD (Metal Organic Chemical Vapor Deposition).

It is preferable that the layer 12 that is a single-crystal substance be formed by PLD (Pulsed Laser Deposition). When a PCMO single-crystal substance is formed as the information storage layer 12, a $LaAlO_3$ (LAO) substrate is suitable as the substrate 10. In the case of using the LAO substrate, it is recommended that a $YBa_2Cu_3O_7$ (YBCO) film be formed as a layer having the function as a buffer layer for causing the information storage layer 12 to be grown into a single crystal and further as the lower electrode 11.

On the other hand, when growing a polycrystalline substance, it is recommended that, for example, a platinum (Pt) thin film be formed as the lower electrode 11 on a silicon substrate with a thermally oxidized film, which serves as the substrate 10, and the information storage layer 12 be formed thereon by spin-coating or the like. It is preferable that the face on which the perovskite structure is to be grown is composed of Pt or Ir.

The film thickness of the information storage layer 12 should preferably be in the range of 10 nm to 600 nm, and particularly preferably in the range of 50 nm to 200 nm. When the information storage layer 12 is thin, a resistance change in this layer is easily induced. Taking this into consideration, the film thickness of the layer 12 may be set at 150 nm or less.

Preferable examples of the material of the substrate 10 include Ge, GaAs, InP, InSb, InAs, GaAs, $SrTiO_3$, sapphire, and MgO, other than the above-noted silicon and LAO. In addition, preferable examples of the material of the electrodes 11 and 13 include Ag, Au, Cu, $LaSrCoO_3$, $RuO_2$, $IrO_2$, $SrRuO_3$, Al, Ta, TaSiN, and MoN, other than the above-noted YBCO, Pt, and Ir.

Two interfaces 18 and 19 exist between the information storage layer 12 and the layers that are adjacent thereto (adjacent layers). In the configuration shown in FIG. 1, the adjacent layers are the first electrode (lower electrode) 11 and the second electrode (upper electrode) 13. The information storage layer 12 has depressions and/or protrusions in either one or both of the two interfaces 18 and 19 with the adjacent layers 11 and 13. In this example, the information storage layer 12 has two or more depressions 15 in the upper interface (upper face) 19 with the upper electrode 13, but has neither depressions nor protrusions in the lower interface (lower face) 18 with the lower electrode 11.

Figure 2:
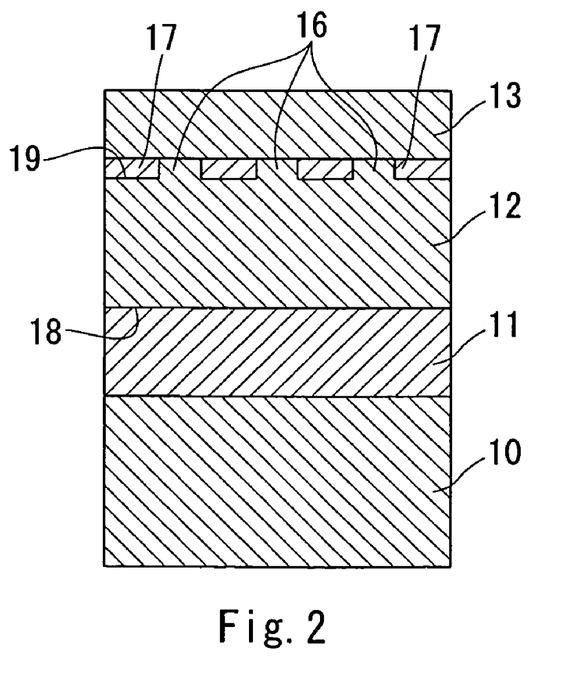
FIG. 2 is a cross-sectional view illustrating another example of the variable resistance element according to the present invention.

In the configuration shown in FIG. 2, the information storage layer 12 has two or more protrusions 16 in the upper face 19 but has neither depressions nor protrusions in the lower face 18. In this example, a planarized layer 17 for alleviating the surface unevenness created by the protrusions 16 is interposed between the information storage layer 12 and the upper electrode 13. Thus, the planarized layer 17 for alleviating the layer 12's surface roughness caused by the depressions 15 and/or the protrusions 16 may be disposed at an interface between the information storage layer 12 and the adjacent layers 11, 13. Disposing the planarized layer 17 makes it possible to stack the upper electrode 13 or other layers on a planar surface.

The planarized layer 17 may be any of conductor, semiconductor, and insulator. Preferable examples of the insulator usable for the planarized layer 17 include $SiO_2$, SiN, and $Al_2O_3$, but the use of an organic insulator is also possible.

Figure 3A:
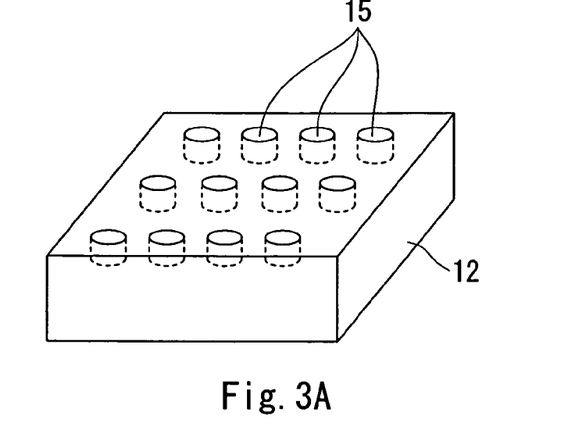
FIGS. 3A and 3B are perspective views each illustrating an example of the configuration and arrangement of depressions of an information storage layer.
Figure 3B:
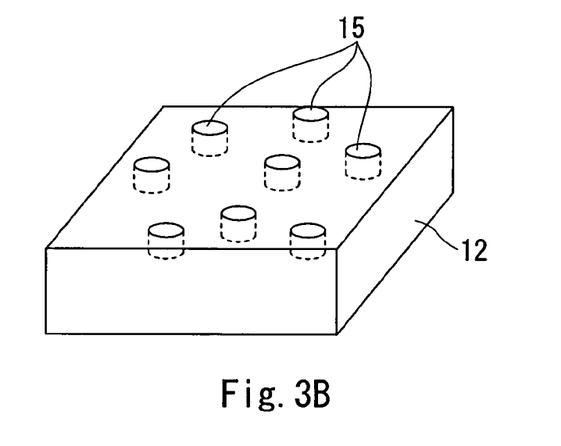
Figure 4:
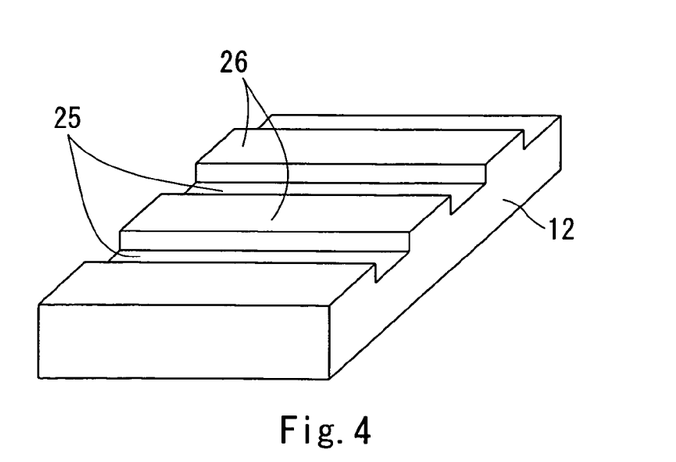
FIG. 4 is a perspective view illustrating an example of the configuration and arrangement of depressions and protrusions of the information storage layer.

There are no restrictions on the number and arrangement of the depressions 15 and the protrusions 16. For example, the information storage layer 12 may have depressions 15 that are regularly aligned, as illustrated in FIG. 3A, or may have depressions 15 that are irregularly aligned, as illustrated in FIG. 3B. The shapes of the depressions 15 and the protrusions 16 are not necessarily limited to columnar shapes as shown in the figures. For example, the information storage layer 12 may have depressions 25 and protrusions 26 extending in a predetermined direction, as illustrated in FIG. 4.

The size of the depressions 15, 25 and/or the protrusions 16, 26 are not particularly limited as long as the advantageous effects by the present invention can be attained; however, it is generally recommended that the depth (height) of the depressions (protrusions) be 1/100 or greater of the film thickness of the information storage layer 12. It should be noted that, in order to reliably produce starting points that are effective for triggering a resistance change in the layer 12, it is preferable that the depth or height of at least one selected from depressions and protrusions be $\frac{1}{40}$ or greater, and particularly $\frac{1}{10}$ or greater, of the film thickness of the layer 12.

There are no restrictions on the number per unit area, in other words, the surface density, of the depressions 15, 25 and/or protrusions 16, 26. However, when the information storage layer 12 is made of a polycrystalline substance, it is preferable that the number of at least one selected from depressions and protrusions be greater than the number of crystals that constitute a polycrystalline substance being in contact with the interface in which the at least one selected from depressions and protrusions exists. The purpose of this is to reduce the voltage of the electric pulse for writing information and to suppress variations in its width (duration) reliably. In the case where the layer 12 is a single-crystal substance too, it is desirable that the surface density of the depressions 15, 25 and/or the protrusions 16, 26 be great to the extent as described above.

Specifically, it is preferable that at least one selected from depressions and protrusions exist at a proportion of $100/\mu m^2$ or greater in the interface 18, 19 of the information storage layer 12, more preferably $1000/\mu m^2$ or greater, and still more preferably $10000/\mu m^2$ or greater.

At the depressions 15, 25 and/or the protrusions 16, 26, the information storage layer 12 tends to produce distortions, thus forming crystal defects or dislocations easily. It is believed that when a voltage is applied, these become structural starting points, causing a change in the resistance state of the layer 12. In the layer 12, when a voltage sufficient to change the resistance state is applied to a portion of the layer 12, the resistance state changes at the portion and the resulting change propagates to the surrounding portions. Thus, it is believed that the resistance state of the layer 12 changes at a lower voltage when the depressions 15, 25 and/or the protrusions 16, 26 exist than when no depressions or protrusions exist.

The depressions 15, 25 and/or the protrusions 16, 26 can be formed using a general lithography technique, such as resist exposure, physical or chemical milling, or vapor deposition.

Hereinbelow, as a preferable example of the method of forming the depressions 15, 25 and/or the protrusions 16, 26, a method using microparticles is described with reference to FIGS. 5A to 5C.

A lower electrode 51 is formed on, for example, a Si substrate 50 having a thermally oxidized film on its surface. An example of the preferable material for the lower electrode 51 is Pt. Next, microparticles 54 are dispersed on a surface 51a of the lower electrode 51. Under this condition, the surface of the lower electrode 51 is irradiated with ions 57, such as argon ions, for example, with the use of a physical etching apparatus using an ion gun (FIG. 5A).

With this ion irradiation, the microparticles 54 are removed by etching while the surrounding portions are also etched using the microparticles 54 as a mask. Thus, protrusions 51b are formed on the surface 51a of the lower electrode 51 (FIG. 5B).

Figure 5A:
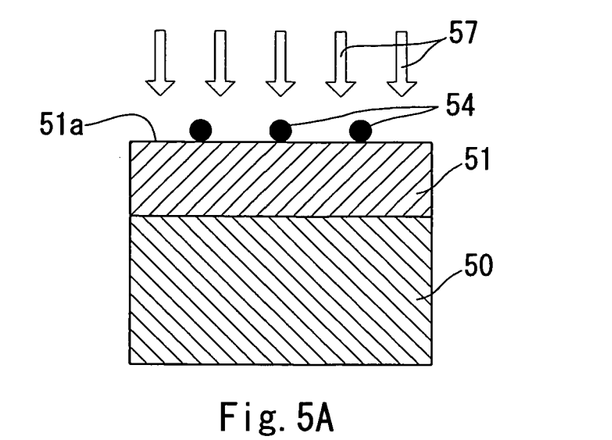
FIGS. 5A to 5C are cross-sectional views each illustrating a step of a manufacturing method according to the present invention.
Figure 5B:
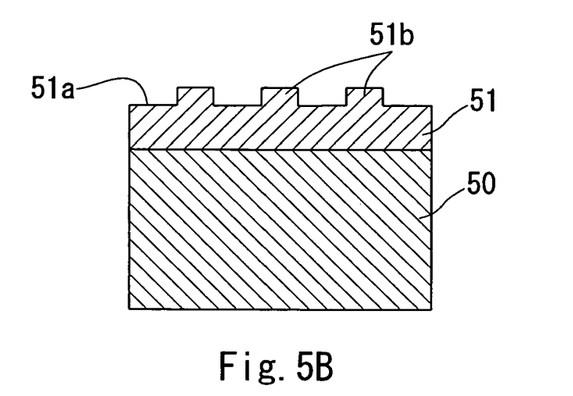
Figure 5C:
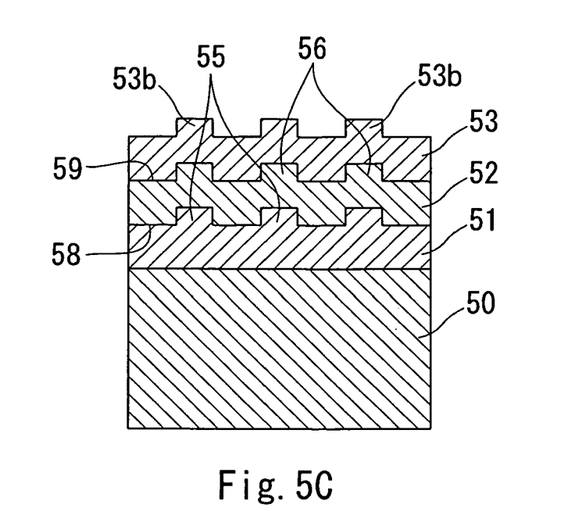

Subsequently, the information storage layer 52 and the upper electrode 53 are formed (FIG. 5C). Protrusions 56 and 53b, which reflect the protrusions 51b, emerge on the surfaces of these layers 52 and 53, respectively. Thus, in the information storage layer 52, depressions 55 (depressions that reflect the protrusions 51b of the lower electrode 51) are formed in a lower face 58 thereof, and the protrusions 56 are formed in an upper face 59 thereof, respectively.

In the example illustrated in FIGS. 5A to 5C, microparticles 54 are removed; however, part of, or all of, the microparticles 54 may be left unremoved.

Figure 6A:
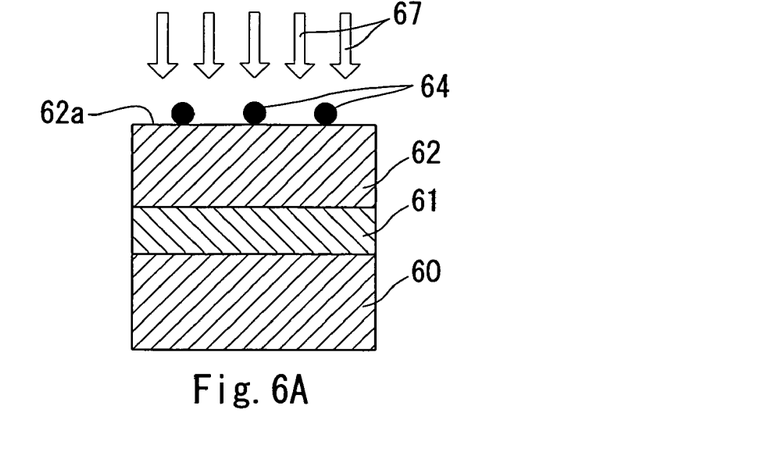
FIGS. 6A to 6C are cross-sectional views each illustrating a step in another example of the manufacturing method according to the present invention.
Figure 6B:
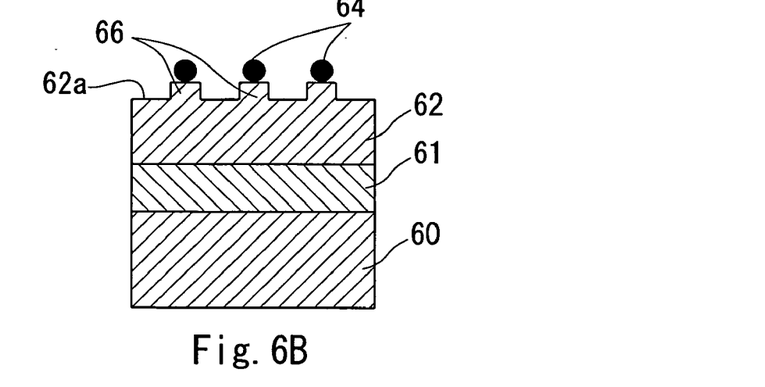
Figure 6C:
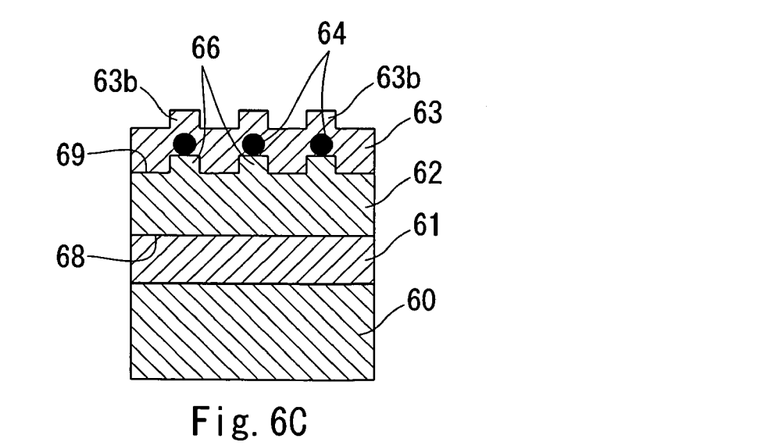

FIGS. 6A to 6C illustrate another example of forming protrusions and depressions using microparticles.

In this example, microparticles 64 are dispersed over a surface 62a of an information storage layer 62 formed on a lower electrode 61 and a substrate 60, and the surface 62a is irradiated with ions 67 (FIG. 6A). With this ion irradiation, protrusions 66 are formed on the surface 62a of the information storage layer 62 (FIG. 6B). In this example, since an upper electrode 63 is formed in the state in which the microparticles 64 are left unremoved, the microparticles 64 are buried in the upper electrode 63 and stay above the protrusions 66 of the information storage layer 62 (FIG. 6C). The information storage layer 62 has neither depressions nor protrusions in a lower face 68 thereof but has the protrusions 66 in an upper face 69 thereof. In this illustrative example as well, protrusions 63b are formed on a surface 63a of the upper electrode 63 and above the microparticles 64.

When the remaining microparticles 64 are of a conductive material such as a metal, the microparticles 64 function as a part of the electrode 63. It should be noted, however, that the microparticles 64 may be of an insulator of an organic substance, an oxide, or the like. The microparticles may be left unremoved as long as they do not bring about a problem such as causing a reaction with other substances in the subsequent processes or the use environment.

When the protrusions 53b, 63b emerging on the surfaces of the upper electrodes 53, 63 may cause a problem in the following element-forming processes, the protrusions 53b, 63b may be removed using such techniques as CMP (Chemical Mechanical Polishing) or cluster ion beam etching and the surface of the upper electrodes 53, 63 may be planarized.

It should be noted that, as will be discussed later, by forming the information storage layers 52, 62 by spin-coating, the surface unevenness formed on the surfaces of the layers 52, 62 can be alleviated, or moreover can be substantially planarized. It is recommended that the layers 52, 62 be formed by spin-coating when the surface of the information storage layers 52, 62 should be planarized.

The method using the microparticles 54, 64 are suitable for forming a large number of small depressions 55 and/or protrusions 56, 66. It is advisable in the present invention that at least one selected from depressions and protrusions be formed by etching using the microparticles as a mask.

In the above illustrative examples, the process of forming depressions and/or protrusions was carried out on the surface 62a of the information storage layer 62 or the surface 51a of the lower electrode 51. It should be noted that the process of forming the unevenness does not need to be performed directly on the surfaces 51a and 62a.

For example, in order to form depressions and/or protrusions in the surface 51a of the lower electrode (first electrode) 51, the lower electrode 51 may be formed in such a manner that a surface of the substrate 50 is processed so as to provide the surface with depressions/protrusions so that depressions/protrusions originating from the resulting depressions/protrusions emerge in the surface 51a. In place of this, it is also possible to form a portion of the lower electrode 51 on the substrate 50, the surface of which is then processed so as to provide it with depressions/protrusions, and the remaining portion of the lower electrode 51 is formed so that depressions/protrusions originating from the resulting depressions/protrusions are reflected in the surface 51a. Likewise, the formation of depressions and/or protrusions in the surface 62a of the information storage layer 62 may be performed by providing depressions/protrusions to a substructure below the surface 62*a*. A film that has a surface reflecting the substructure can be easily formed by sputtering, CVD, or the like.

Thus, the manufacturing step of forming at least one selected from depressions and protrusions in a surface of the information storage layer or the first electrode (lower electrode) may be performed by a method that includes: a step of forming depressions and/or protrusions in a surface (underneath surface) located below the targeted surface, and a step of forming a film that is interposed between the targeted surface and the underneath surface so that depressions and/or protrusions originating from the formed depressions and/or protrusions are reflected on the targeted surface.

It should be noted that each of the lower electrodes 51, 61, the upper electrodes 53, 63, and the information storage layers 52, 62 may be made of multiple layers. For example, the lower electrodes 51, 61 may have a double layer structure made of a relatively thick film and a relatively thin film that is interposed between the thick film and the information storage layer 52, 62. In this case, irrespective of the main purpose of forming the relatively thin film, the relatively thin film constitutes the lower electrode together with the relatively thick film as long as these films function as the lower electrode.

The diameter of the microparticles 54, 64 may be appropriately selected depending on the size of the depressions (protrusions), although the suitable diameter is 1 nm or greater, and preferably 2 nm or greater; but 100 nm or less, preferably 50 nm or less, and more preferably 10 nm or less. The microparticles may be of an organic substance or an inorganic substance.

Usable as the microparticles is, for example, one in which metallic microparticles of Au, Co, Fe, Pt, or the like of about 1 nm to several ten nanometers in size that are controlled with a protective colloid so as not to aggregate are made into a colloidal state and stabilized using an organic substance such as an oleic acid. It is recommended that the microparticles be dispersed over the substrate using a method referred to as self-organization (see, for example, JP 2000-54012A). Known microparticles using an organic substance include those using a block copolymer and those using a graft copolymer (for example, cf M. Park et al., Science, vol. 276, pp. 1401–1406; and JP 2001-151834A).

As illustrated in the foregoing examples, the information storage layer may have depressions and/or protrusions in both its upper and lower faces (interfaces), or may have depressions and/or protrusions in only one of the faces. In the former case, the information storage layer has at least one selected from depressions and protrusions in the interface with the lower electrode (first electrode) and in the interface with the upper electrode (second electrode). In the latter case, the information storage layer has at least one selected from depressions and protrusions in the interface with either one of the electrodes selected from the lower electrode (first electrode) and the upper electrode (second electrode), and the layer is substantially planar in the interface with the other one of the electrodes selected from the lower electrode (first electrode) and the upper electrode (second electrode).

In order to grow a good quality information storage layer, it is preferable that the face of the information storage layer that is on the lower electrode side be substantially planar (FIGS. 1, 2, and 6C). Taking this into consideration, it is preferable that the information storage layer be substantially planar in the interface with the lower electrode (first electrode), and this layer have at least one selected from depressions and protrusions in the interface with the upper electrode (second electrode).

This preferable structure can be obtained by, for example, a method including the manufacturing step of forming the information storage layer without forming either depressions or protrusions on a surface of the lower electrode (first electrode), in other words, forming the information storage layer on a substantially planar surface of the lower electrode, and forming at least one selected from depressions and protrusions on a surface of this layer.

In order to stack a good quality upper electrode or other layers on the information storage layer, it is preferable that the face of the information storage layer that is on the upper electrode side be substantially planar. Taking this into consideration, the information storage layer have at least one selected from depressions and protrusions in the interface with the lower electrode (first electrode) and this layer is substantially planar in the interface with the upper electrode (second electrode).

This preferable structure can be obtained by, for example, a method including the steps of forming at least one selected from depressions and protrusions on the lower electrode (first electrode), forming the information storage layer on the surface of this electrode so that the surface thereof becomes substantially planar (for example, by spin-coating), and forming the upper electrode (second electrode) on the surface of this layer without forming either depressions or protrusions.

The method of the present invention is not limited to the foregoing illustrative examples, but may be a method including the steps of: forming at least one selected from depressions and protrusions on the surface of the lower electrode (first electrode), and forming the information storage layer on the surface of this electrode so that at least one selected from depressions and protrusions originating from the foregoing at least one selected from depressions and protrusions emerges on the surface of the information storage layer (cf FIGS. 5A to 5C).

Hereinbelow, an operation of the variable resistance element is described.

Assume that the information storage layers 12, 52, 62 are in a low resistance state as their initial state. In this state, if, for example, the lower electrodes 11, 51, and 61 are brought down to zero potential and an electric pulse with a voltage $V_W$ (V) is applied to the upper electrodes 13, 53, 63 for a predetermined duration, the layers 12, 52, 62 are changed into a high resistance state and their resistance values are increased. With the information storage layers 12, 52, 62 being in a high resistance state, if, for example, the upper electrodes 13, 53, 63 are brought down to zero potential and an electric pulse with a voltage $V_W$ (V) is applied for a predetermined duration to the lower electrodes 11, 51, 61, the layers 12, 52, 62 are changed into a low resistance state.

In this way, the resistance state of the layers 12, 52, 62 reversibly changes by applying an electric pulse across the two surfaces of these layers. The resistance state of the layers 12, 52, 62 is maintained even without applying an electric pulse, so the elements containing these layers can be used as a non-volatile memory.

The resistance state of the information storage layers 12, 52, 62 can be identified by applying an electric pulse at a voltage $V_R$ (V) ($V_R<V_W$), a magnitude that does not change the resistance state of these layers, to read out the current value. This electric pulse may be of either polarity.

For example, it is defined that the high resistance state corresponds to "1" and the low resistance state corresponds to "0", respectively. With this variable resistance element, "1" is recorded by applying an electric pulse at a voltage $V_W$ (V), while "0" is recorded by applying an electric pulse at a voltage $-V_W$ (V). This recorded information can be reproduced by applying an electric pulse at a voltage $V_R$ (V). The absolute values of the voltages $V_W$ (V) and $-V_W$ (V) need not be the same and may be determined taking the voltage required for the respective recording operations into consideration.

This variable resistance (memory) element is combined with a semiconductor element such as a transistor, a diode, or the like to construct a 1-bit cell; and by combining a large number of such cells, multi-bit memory cells are constructed. The present invention also provides a non-volatile memory containing two or more variable resistance elements according to the present invention and two or more diodes or transistors.

Figure 7A:
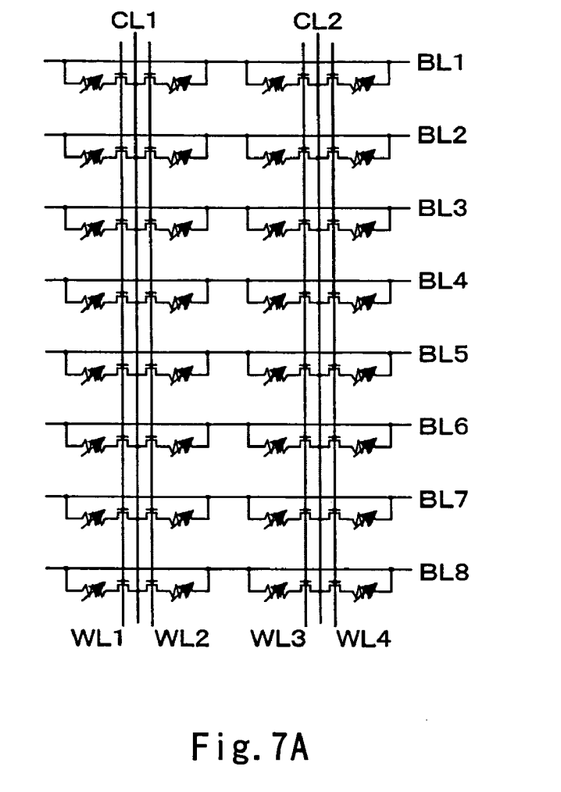
FIG. 7A is a partial circuit diagram illustrating one example of a circuit of a non-volatile memory.
Figure 7B:
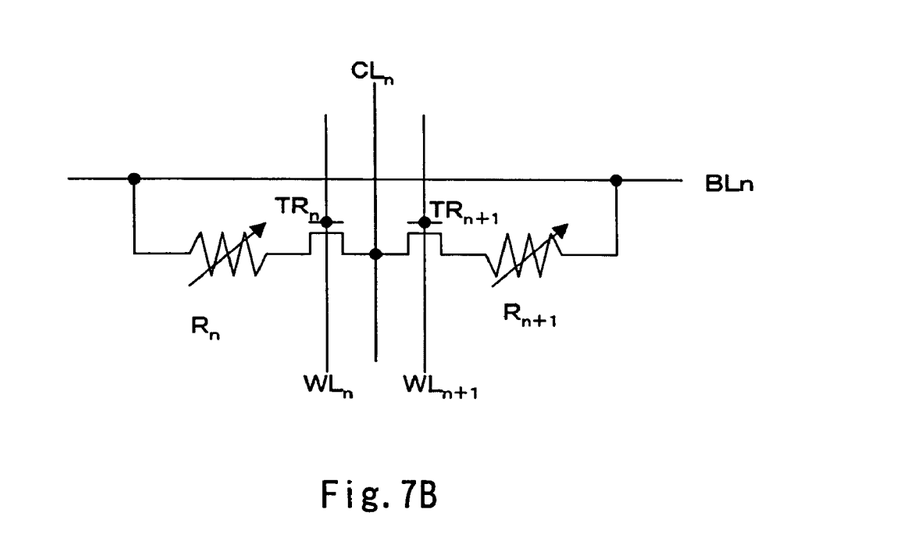
FIG. 7B is a partially-enlarged view of FIG. 7A.

FIG. 7A shows an illustrative example of a circuit of a non-volatile memory. FIG. 7B is a partially-enlarged view of FIG. 7A (in FIG. 7B, n is an integer shown in FIG. 7A). It is recommended that in a non-volatile memory, the variable resistance elements and transistors (or diodes) be connected electrically in series as illustrated in the figures. The operation of this non-volatile memory is described below as an illustrative example.

In the case where "1" is to be written into a variable resistance element (memory element) $R_n$ that is in a low resistance state "0", a predetermined voltage $V_G$ is applied to a word line $WL_n$ corresponding to this element to turn the gate of a transistor $TR_n$ into an on state. In that state, a common line $CL_n$ is grounded, and a predetermined voltage $V_W$ is applied to a bit line $BL_n$. Thus, once "1" is recorded in the memory element $R_n$, the state of "1" can be maintained without supplying electrical energy to any of $CL_n$, $BL_n$, or $WL_n$.

In the case of writing "0" into this memory element $R_n$, in other words, in the case of initializing this memory element, while the transistor $TR_n$ is being turned on by applying the foregoing predetermined voltage $V_G$ to the word line $WL_n$, the bit line $BL_n$ is grounded and a predetermined voltage $V_W$ is applied to the common line $CL_n$.

In the case of reproducing, while the transistor $TR_n$ is being turned on by applying a voltage to the word line $WL_n$, the common line $CL_n$ is grounded and a predetermined voltage $V_R$ ($V_R < V_W$) is applied to the bit line $BL_n$ to read a current that flows through $BL_n$. Thereby, the resistance value of $R_n$ is identified, and it is determined whether the resistance value corresponds to a low resistance state "0" or a high resistance state "1".

The foregoing example has described a case in which recording and reproducing are performed with a binary state of "1" and "0". However, a multi-level state recording is also possible when the dynamic range of the resistance change in the variable resistance element is wide, that is, the amount of the resistance change is large and when discrete resistance values can be controlled by voltages, for example, when resistance values can be controlled at multi levels by widths (durations) of pulse voltages.

Figure 8:
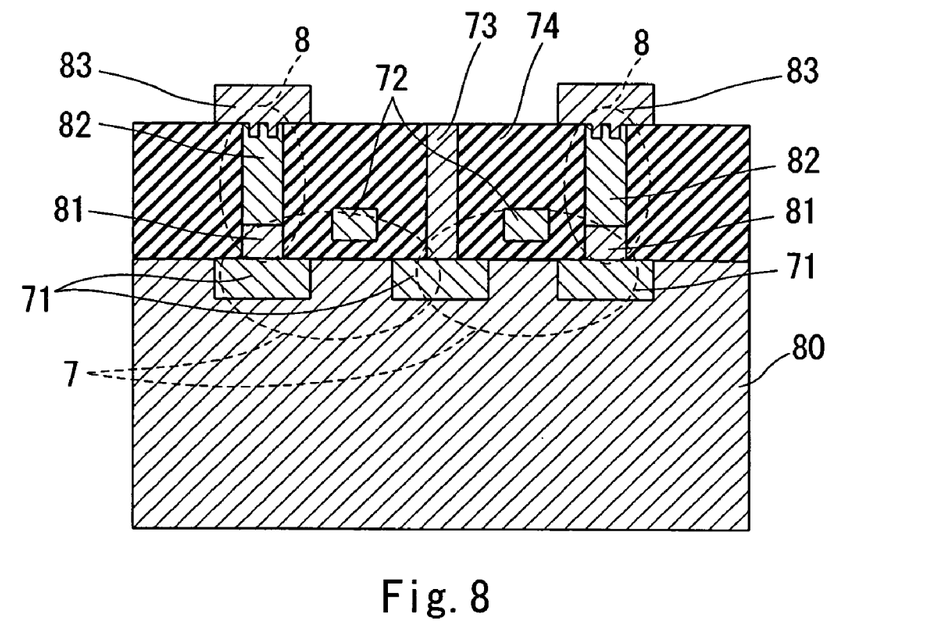
FIG. 8 is a cross-sectional view illustrating one example of a non-volatile memory according to the present invention.

FIG. 8 illustrates an example of the configuration of the non-volatile memory shown in FIG. 7B. This memory has two variable resistance elements 8 and two transistors 7 respectively connected to the two elements 8. Each of the transistors 7 includes a source and a drain 71, which is an n-type portion formed within a p-type silicon substrate 80, and a gate electrode 72 formed within an insulating film 74. An outlet electrode 73, which is connected to a common line, is connected to the source (drain) 71 that is shared by the two transistors. Each of the variable resistance elements 8 includes a lower electrode 81, an information storage layer 82, and an upper electrode 83 also serving as a bit line, all of which are formed above the source or drain 71.

Figure 9:
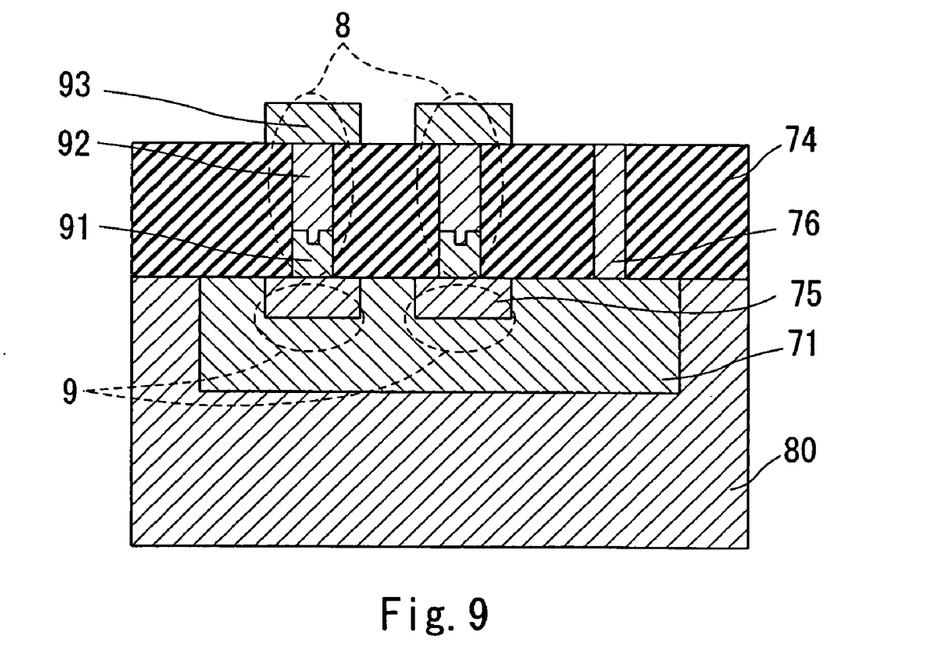
FIG. 9 is a cross-sectional view illustrating another example of a non-volatile memory according to the present invention.

FIG. 9 illustrates an example of the configuration of a non-volatile memory that uses diodes in place of transistors. This memory includes two variable resistance elements 8 and two diodes 9 respectively connected to the two elements 8. Each of the diodes 9 includes a connection between an n-type portion 71 formed within a p-type silicon substrate 80 and a p-type portion 75 formed within the n-type portion 71. Each of the variable resistance elements 8 includes a lower electrode 91, an information storage layer 92, and an upper electrode 93, all of which are formed above the p-type portion 75, and is disposed within an insulating layer 74 in a similar fashion to that shown in FIG. 8.

In the memory shown in FIG. 9, even if such a potential difference is generated that the potential of a common electrode 76 is higher than the potential of the upper electrodes 93, almost no current flows (OFF state) because of the np junction with the n-type portion 71 and the p-type portion 75. On the other hand, if an opposite potential difference is given to the electrodes 76 and 93, a current flows through the pn junction (ON state).

It should be noted that although in the foregoing examples, all the electrode pairs 11, 13; 51, 53; 61, 63; 81, 83; and 91, 93 are disposed so as to be in contact with only the opposing faces (their upper faces and lower faces) of the respective information storage layers 12, 52, 62, 82, and 92, but the disposition of the electrodes is not limited thereto. The electrodes may be disposed so that a portion or the whole thereof comes in contact with a side face of the information storage layers.

Hereinbelow, the present invention is described in further detail with reference to examples.

EXAMPLE 1

A variable resistance element was fabricated according to the procedure shown in FIGS. 10A to 10D.

Figure 10A:
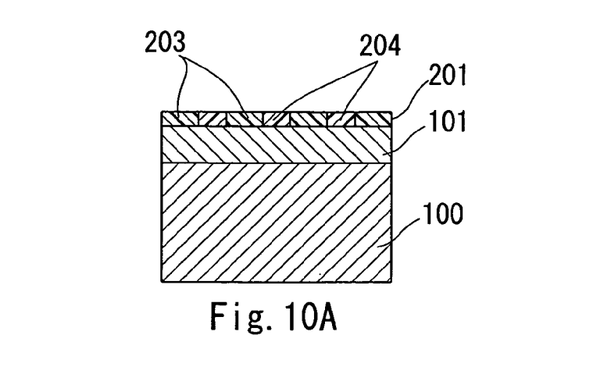
FIGS. 10A to 10D are cross-sectional views illustrating respective manufacturing steps carried out in Example 1.

First, on a p-type silicon substrate 100 on a surface of which an oxide film was formed by thermal oxidation, a 500 nm-thick Pt film was deposited as a lower electrode 101 by sputtering. Subsequently, a diblock copolymer containing polystyrene (PS) of molecular weight 65000 and polymethyl methacrylate (PMMA) of molecular weight 13200 was synthesized, and this was dissolved into propyleneglycolmonoethyletheracetate (PGMEA) as a solvent and coated onto the lower electrode 101 by spin-coating.

After vaporizing the solvent, micro-phase separation of the diblock copolymer was proceeded by heating it at about 100–200° C. A polymer layer 201 after the phase separation was composed of PS portions 204, which have etch resistance, and a PMMA portion 203 surrounding their peripheries (FIG. 10A).

Figure 10B:
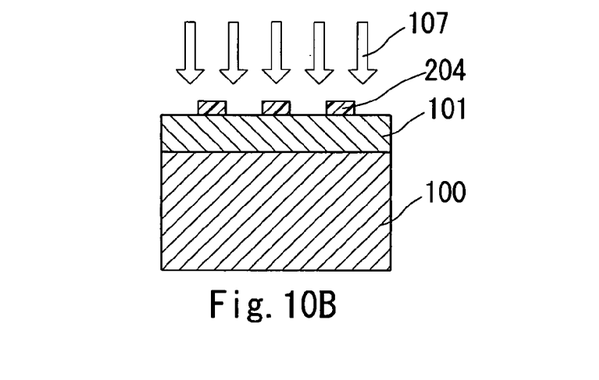
Figure 10C:
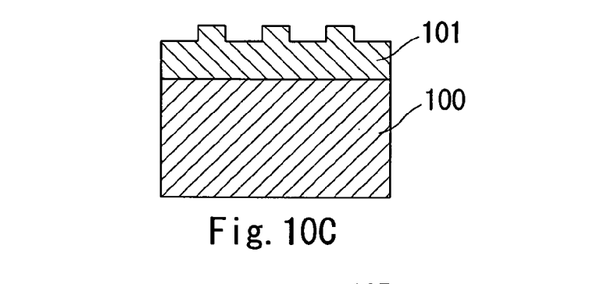

Furthermore, reactive ion etching (RIE) was carried out using $CF_4$ gas (0.01 torr: about 1.33 Pa), so that the PMMA portion 203 was selectively etched by irradiating it with ions 107 using the PS portions 204 as a mask (FIG. 10B). The etching was performed until the surface of the lower electrode 101 was partially recessed, and the remaining PS portions 204 were removed by oxygen ashing (FIG. 10C). On the lower electrode 101, projections (protrusions) having a diameter of about 12 nm and a height of about 15 nm were formed at a density of about 700 pieces per 1 $\mu m^2$ and at approximately uniform intervals.

Figure 10D:
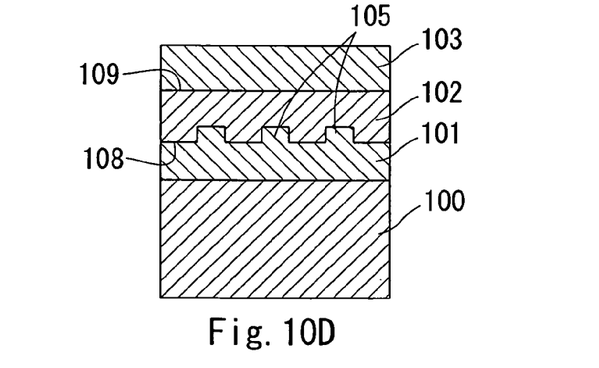

Subsequently, using spin-coating, about 200 nm-thick PCMO ($Pr_{0.7}Ca_{0.3}MnO_3$) film was formed as an information storage layer 102, and further, using sputtering, a Pt film was formed as an upper electrode 103 (FIG. 10D). Thus, a variable resistance element A3 was obtained having the information storage layer 102 having depressions 105 of about 15 nm in depth and about 700 $\mu m^2$ in surface density in its interface (lower face) 108 on the lower electrode 101 side and being substantially planar in its interface (upper face) 109 on the upper electrode 103 side.

The information storage layer (PCMO film) 102 had a substantially planar face on the upper electrode 103 side; the reason is that this layer did not reflect the substructure because this layer was formed by spin-coating. Thus, even without performing an additional manufacturing step after the film deposition, it is possible to form the information storage layer 102 having a surface unevenness in its lower face and being planer in its upper face.

By adjusting the conditions for preparing the block copolymer, such as compositions, molecular weights, and so forth, the shape and surface density of the depressions 105 can be controlled. Thus, elements A1, A2 and A4 to A9 were fabricated in which the depths and surface densities of the depressions 105 were controlled. For comparison, an element B was also fabricated that has an information storage layer 102 with no depressions 105.

With each of the variable resistance elements, an electric pulse that causes a potential difference between the upper and lower electrodes was supplied to measure a minimum voltage that produces a resistance change of 100 times or greater. The width (duration) of the electric pulse was set at 50 ns. The results are shown in Table 1. It should be noted that the data shown in Table 1 are the mean values of measurements with 10 samples of each of the elements.

TABLE 1

| Element | Depth of depressions (nm) | Surface density of depressions (number/$\mu m^2$) | Minimum voltage (V) |
|---|---|---|---|
| A1 | 2 | 700 | 4.0 |
| A2 | 5 | 700 | 3.7 |
| A3 | 15 | 700 | 3.5 |
| A4 | 20 | 700 | 3.2 |
| A5 | 15 | 50 | 4.3 |
| A6 | 15 | 100 | 3.8 |
| A7 | 15 | 500 | 3.6 |
| A8 | 15 | 1000 | 3.3 |
| A9 | 20 | 1000 | 3.1 |
| B | — | — | 5.1 |

The measurement results concerning the elements A1 to A4 and B demonstrate that voltage reduction effects are clearly observed when there are depressions having a depth of about 1/100 of the thickness of the information storage layer (from the comparison between the element A1 and element B), and that it is preferable that depressions having a depth of 1/40 or greater of the thickness of the information storage layer (5 nm or greater in the present example) exist for an information recording using a voltage of less than 4.0 V (the elements A2 to A4).

The measurement results concerning the elements A3, A5 to A8, and B demonstrate that voltage reduction effects are clearly observed when depressions exist at a surface density of about 50/$\mu m^2$ (from the comparison between the element A5 and the element B), and it is preferable that the surface density be 100/$\mu m^2$ or greater for an information recording using a voltage of less than 4.0 V (the elements A3 and A6 to A8).

In each of the elements A2, A5, and A6, the surface density of the depressions 105 was greater than the surface density of the crystals that constitute the information storage layer 102, which is a polycrystalline substance, in the interface 108.

It was confirmed that by forming the depressions, the voltage required for writing information was reduced to about 3 V (the element A9). Taking into consideration that power consumption is approximately proportional to the square of the voltage, this reduction of the write voltage means that a remarkable reduction in the power consumption in memory devices is made possible.

Next, the electric pulses with the minimum voltages as set forth in Table 1 were applied to the elements A1 to A9 and the element B fabricated in the foregoing to measure the pulse widths (durations) with which a resistance change of 100 times or greater was realized, with the elements A1 to A9 and the element B. As in Example 1, 10 samples were prepared for each of the elements A1 to A9 and the element B. (In other words, 10×10=100 samples in total were prepared.) The pulse width was increased by 10 ns. Table 2 shows the minimum values of the pulse widths (the pulse width at which at least one element among the 10 elements showed a change in its resistance state), the maximum values thereof (the pulse width at which all of the 10 elements showed a change in its resistance state), and the differences between the minimum values and the maximum values, together with the voltages applied.

TABLE 2

| Element | Minimum voltage (V) | Minimum pulse width (ns) | Maximum pulse width (ns) | Difference (ns) |
|---|---|---|---|---|
| A1 | 4.0 | 30 | 80 | 50 |
| A2 | 3.7 | 30 | 80 | 50 |
| A3 | 3.5 | 40 | 70 | 30 |
| A4 | 3.2 | 40 | 60 | 20 |
| A5 | 4.3 | 30 | 80 | 50 |
| A6 | 3.8 | 30 | 70 | 40 |
| A7 | 3.6 | 40 | 70 | 30 |
| A8 | 3.3 | 40 | 60 | 20 |
| A9 | 3.1 | 40 | 60 | 20 |
| B | 5.1 | 20 | 100 | 80 |

As will be understood from a comparison in the measurement results between the elements A1 to A9 and the element B, a variation in the electric pulse widths (that is, a difference between the maximum pulse width among the 10 elements having the same depth of depression and the same surface density of depressions and the minimum pulse width among the 10 elements having the same depth of depressions and the surface density of depressions) became remarkably small by forming depressions in a surface of the information storage layer. It is inevitable under the current state of the art that a variation occurs in the electric pulse widths between the same variable resistance elements, but reducing the variation is extremely important in terms of mass production and practical use of these elements.

In Examples 2 to 6 hereinbelow, the description of the manufacturing steps performed in the same manner as in Example 1 will be omitted.

EXAMPLE 2

Referring to FIGS. 7A, 7B and 8, non-volatile memories as described above were fabricated. However, since the variable resistance elements 8 were fabricated almost in the same manner as in Example 1, the depressions/protrusions of the information storage layer 82 existed in the interface on the lower electrode 81 side, not in the interface on the upper electrode 83 side, unlike FIG. 8. The elements 8 were fabricated in the same fashion as those for the element A1 or A4 in Example 1. P (phosphorus) was used as an impurity for forming the n-type portion 71, polysilicon doped with P as the gate electrode 72, Cu as the outlet electrode 73 and the upper electrode 83, and $SiO_2$ as the insulating layer 74, respectively.

These non-volatile memories were made into an array to construct a circuit shown in FIG. 7A. Then, in the manner as described previously, using an electric pulse having a write voltage VW of 4 V and a pulse width 50 ns, "1" was written into one element $R_n$ that was in a low resistance state, and thereafter, using the same electric pulse, "0" was written into the foregoing element that was in a high resistance state. After writing "1" or "0", the resistance of the element was read out using an electric pulse having a read voltage of 1 V. When the elements A4 were formed, the variable resistance elements showed a difference of about 150times in resistance value between the high resistance state and the low resistance state. In contrast, when the conventional elements A1 were formed, the difference in the resistance value remained at about 30 times.

EXAMPLE 3

A variable resistance element was fabricated in the same procedure as shown in FIGS. 5A to 5C. However, since the information storage layer 52 was formed by spin-coating as in Example 1, the interface 59 of the information storage layer 52 that was on the upper electrode 53 side and the surface of the upper electrode became planar, unlike FIG. 5C. Herein, the microparticles 54 were disposed by coating a colloidal solution of Co microparticles. This colloidal solution was prepared as follows.

Oleic acid and trialkylphosphine were dissolved into phenyl ether and heated to 200° C. At 200° C., a phenyl ether solution of dicobalt octacarbonyl was added thereto and stirred. After the solution was cooled to room temperature, methanol was added thereto and Co microparticles were precipitated. The precipitate was separated by a centrifuge, and the precipitate was again dissolved into hexane in the presence of oleic acid. Thus, a colloidal solution of Co microparticles of about 8 nm diameter was obtained.

By dropping this colloidal solution onto the lower electrode 51, the microparticles 54 are dispersed approximately uniformly over the surface 51a of the lower electrode 51 without using a special means. This is because the metal is in a colloidal state and therefore the particles are self-organized without aggregating one another. Next, organic substances were removed by oxygen ashing, and a state was obtained in which the microparticles 54 were dispersed on the lower electrode 51 (FIG. 5A).

Furthermore, by an etching through ion milling with the irradiation of ions 58, the microparticles 54 were removed and protrusions 51b were formed (FIG. 5B). The protrusions 51b were about 8 nm in height, about 10 nm in diameter, and about 1000/$\mu m^2$ in surface density. Subsequently, the information storage layer 52 and the upper electrode layer 53 were deposited consecutively (FIG. 5C).

In the foregoing manufacturing method as well, the depth, the surface density, etc. of the depressions formed on the information storage layer 52 can be controlled by adjusting the size or density of Co microparticles. While controlling these, the same measurement as in Example 1 was performed, wherein almost the same results as those obtained in Example 1 were obtained concerning the relationship between the element's characteristics and the depth and surface density of the depressions 55.

EXAMPLE 4

Figure 11A:
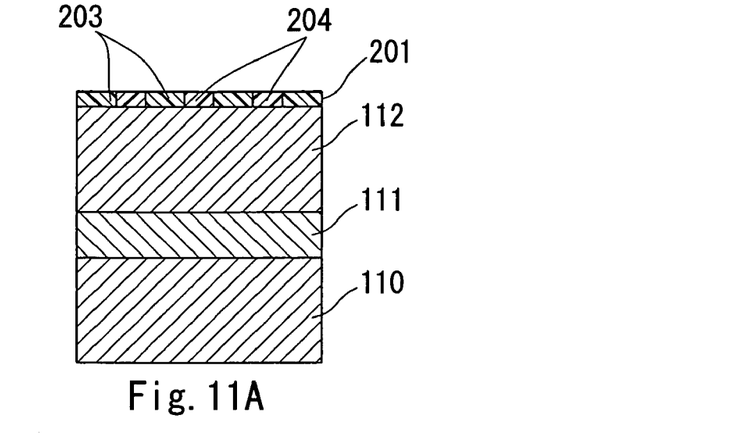
FIGS. 11A to 11C are cross-sectional views illustrating respective manufacturing steps carried out in Example 4.
Figure 11B:
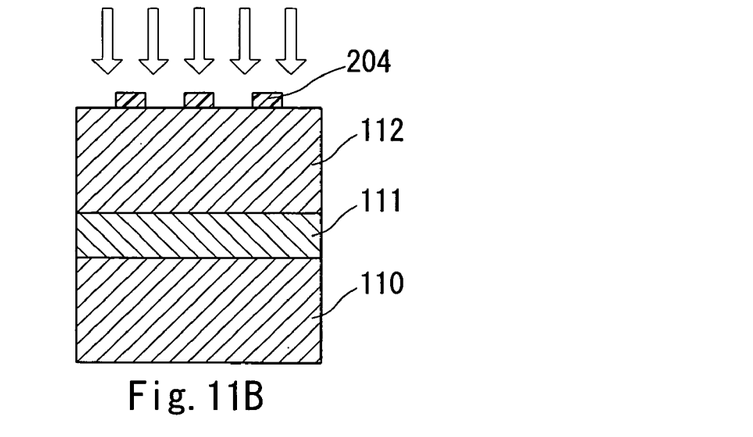
Figure 11C:
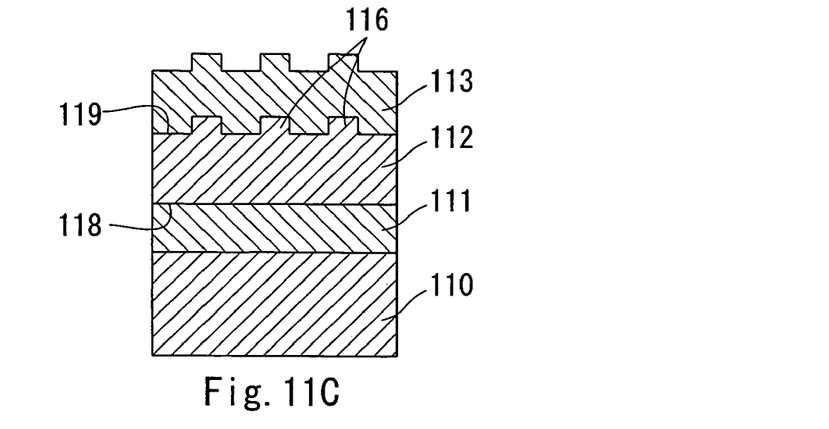

A variable resistance element was fabricated according to the procedure as shown in FIGS. 11A to 11C.

In this Example, not a surface of a lower electrode 111 formed on a substrate 110 but a surface of an information storage layer 112 formed on the lower electrode 111 was processed to form protrusions 116 on an upper face 119 of the layer 112. A lower face 118 of this layer 112 was planar. The protrusions 116 were formed by forming a polymer layer 201 using a block copolymer composed of PS and PMMA, and etching a PMMA portion 203 using PS portions 204 as a mask, as in a similar manner to Example 1. An upper electrode 113 was also formed in a similar manner to Example 1 (FIGS. 11A to 11C).

With the variable resistance element thus obtained, the same measurement as in Example 1 was performed while controlling the depth and surface density of the protrusions 116, wherein almost the same results as those obtained in Example 1 were obtained concerning the relationship between the element's characteristics and the depth and surface density of the protrusions 116.

EXAMPLE 5

Figure 12A:
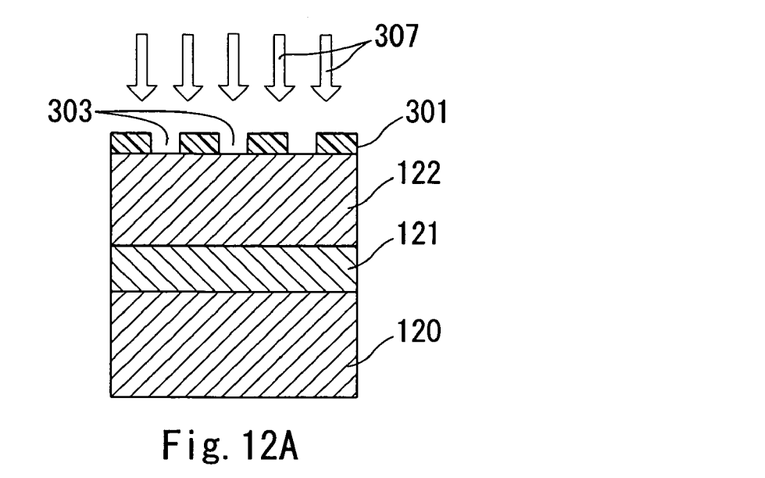
FIGS. 12A to 12C are cross-sectional views illustrating respective manufacturing steps carried out in Example 5.
Figure 12B:
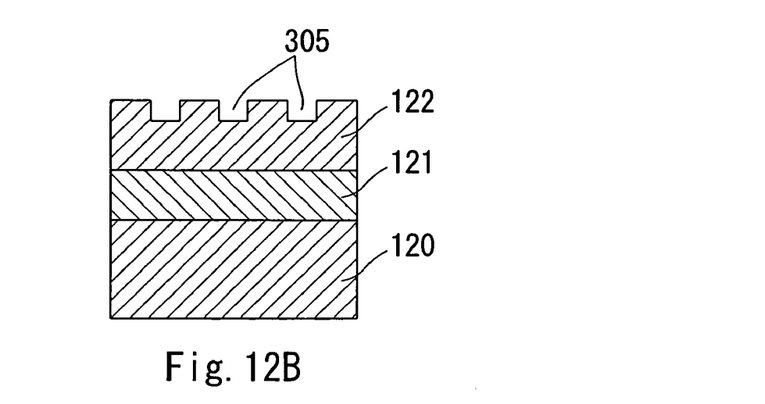
Figure 12C:
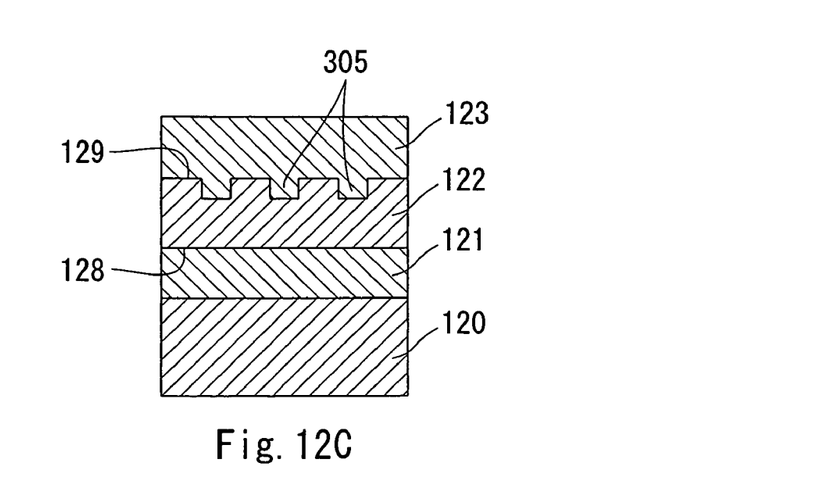

A variable resistance element was fabricated according to the procedure as shown in FIGS. 12A to 12C.

In this Example as well, not a surface of a lower electrode 121 formed on a substrate 120 but a surface of an information storage layer 122 was processed. It should be noted that in the present example, the film thickness of the information storage layer 122 (PCMO film) was set at about 100 nm.

The method of forming depressions in the present example will be described. First, a resist pattern 301 having predetermined apertures 303 was formed on the information storage layer 122 by X-ray lithography. Here, the apertures 303 had dimensions of about 20 nm×20 nm and were arranged in a matrix at about 50 nm intervals.

Next, by performing an ion milling with argon ions 307 using the resist pattern 301 as a mask, the portions of the information storage layer 122 that were exposed from the apertures 303 were etched away (FIG. 12A). Thus, depressions 305 were formed in the surface of this layer 122, and further, the resist pattern 301 was removed (FIG. 12B). The depressions 305 were slightly smaller than the apertures 303 (15 nm×15 nm), and the depth was 3 nm. Subsequently, on the information storage layer 122, an upper electrode layer 123 was deposited, and the surface of this layer was planarized using cluster ion beam and CMP (FIG. 12C). An upper face 129 of the information storage layer 122 was provided with the depressions 305, while a lower face 128 was made planar.

With the variable resistance element thus obtained, the same measurement as in Example 1 was performed while controlling the depth and surface density of the depressions 305, wherein almost the same results as those obtained in Example 1 were obtained concerning the relationship between the element's characteristics and the depth and surface density of the depressions 305.

EXAMPLE 6

A variable resistance element was fabricated according to the procedure as shown in FIGS. 13A to 13D.

Figure 13A:
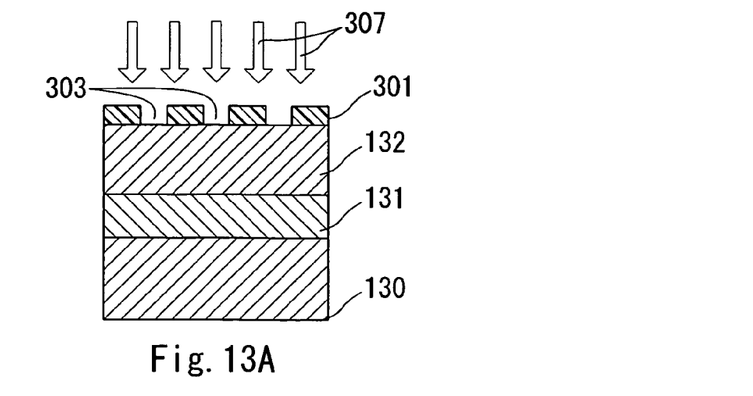
FIGS. 13A to 13D are cross-sectional views illustrating respective manufacturing steps carried out in Example 6.

In this Example, a MgO substrate was used as a substrate 130, and the film thickness of an information storage layer (PCMO film) 132 was set at 100 nm.

Figure 13B:
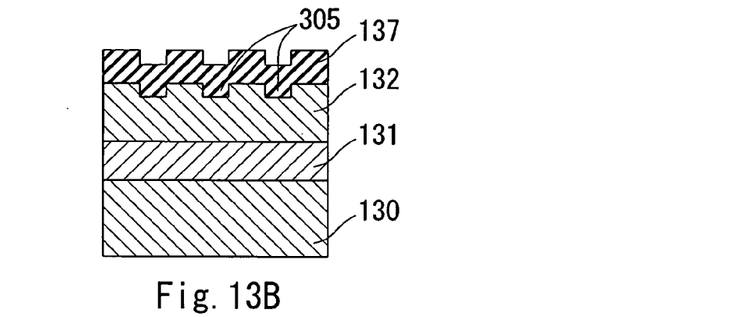
Figure 13C:
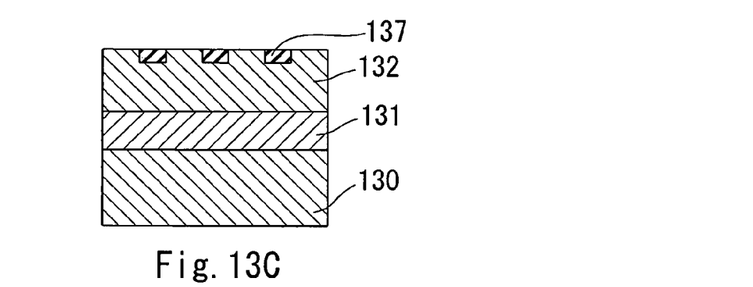
Figure 13D:
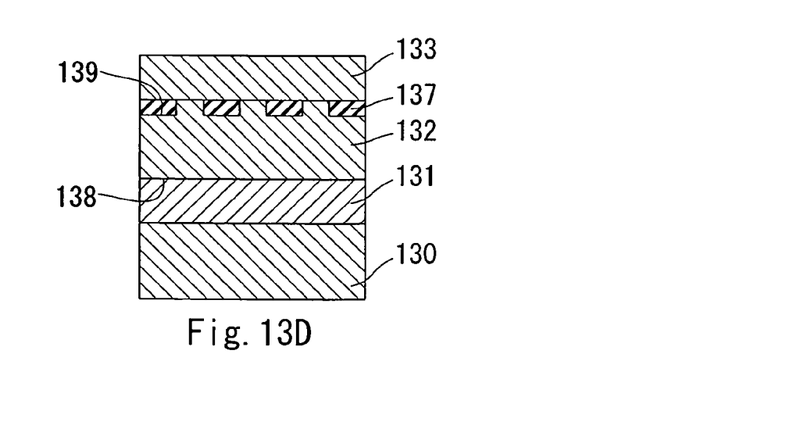

After a lower electrode 131 and an information storage layer 132 were consecutively formed on a substrate 130, a resist pattern 301 having apertures 303 was formed on a surface of the information storage layer 132 and further an ion milling using argon ions 307 was performed in the same manner as in Example 5 (FIG. 13A). Subsequently, depressions 305 were formed in the surface of the information storage layer 132, and on this layer, an $Al_2O_3$ film was formed as a planarized layer 137 by sputtering (FIG. 13B). The depressions 305 were 25 nm×10 nm in dimensions and 8 nm in depth, and were spaced at 80 nm intervals. Subsequently, a surface of the planarized layer 137 was scraped using cluster ion beam and CMP until the surface of the information storage layer 132 was exposed (FIG. 13C). Thereafter, an upper electrode 133 was formed (FIG. 13D). An upper face 139 of the information storage layer 132 was provided with depressions in which the planarized layer 137 was filled, while the lower face 138 was made planar.

With the variable resistance element thus obtained, the same measurement as in Example 1 was performed while controlling the depth and surface density of the depressions 305, wherein almost the same results as those obtained in Example 1 were obtained concerning the relationship between the element's characteristics and the depth and surface density of the depressions 305.

INDUSTRIAL APPLICABILITY

As has been described above, the present invention has great usefulness as it enhances the practical utility of a variable resistance element that is suitable as memory devices for computers and mobile information terminals and employs a layer the resistance value of which can be varied by the application of an electric pulse. The variable resistance element of the present invention can be used not only as a memory element but also as a switching element for controlling electricity, heat, magnetism, light, and so forth, a rectifier element, and the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of driving a non-volatile memory comprising: a variable resistance element, the variable resistance element comprising a first electrode, a layer in which its resistance is variable by applying an electric pulse thereto, the layer being formed on the first electrode, and a second electrode formed on the layer; wherein the layer has a perovskite structure; and the layer has at least one selected from depressions and protrusions in an interface with at least one electrode selected from the first electrode and the second electrode; and a diode or a transistor electrically connected to the variable resistance element; the method comprising the steps of:

changing a resistance state of the layer from a low resistance state to a high resistance state or vice versa by applying a write electric pulse across the first electrode and the second electrode; and identifying the resistance state of the layer by applying, across the first electrode and the second electrode, a read electric pulse that does not change the resistance state of the layer and is capable of reading out the resistance state.

2. The method of driving a non-volatile memory according to claim 1, wherein the resistance state of the layer is changed by applying a write electric pulse having a voltage of 4.0 V or less.

3. The method of driving a non-volatile memory according to claim 1, wherein the at least one selected from depressions and protrusions exists at a proportion of 100/$\mu m^2$ or greater.

4. The method of driving a non-volatile memory according to claim 3, wherein the height or the depth of the at least one selected from depressions and protrusions is $\frac{1}{40}$ or greater of the thickness of the layer.

5. The method of driving a non-volatile memory according to claim 1, wherein the height or the depth of the at least one selected from depressions and protrusions is $\frac{1}{40}$ or greater of the thickness of the layer.

6. The method of driving a non-volatile memory according to claim 1, wherein:

the layer has the at least one selected from depressions and protrusions in an interface with either one of the electrodes selected from the first electrode and the second electrode; and the layer is substantially planar in an interface with the other one of the electrodes selected from the first electrode and the second electrode.

7. The method of driving a non-volatile memory according to claim 6, wherein:

the layer has the at least one selected from depressions and protrusions in the interface with the first electrode; and the layer is substantially planar in the interface with the second electrode.

8. The method of driving a non-volatile memory according to claim 6, wherein:

the layer is substantially planar in the interface with the first electrode; and the layer has the at least one selected from depressions and protrusions in the interface with the second electrode.

9. The method of driving a non-volatile memory according to claim 1, wherein the layer has the at least one selected from depressions and protrusions in the interface with the first electrode and in the interface with the second electrode.

10. The method of driving a non-volatile memory according to claim 1, wherein the layer is made of a polycrystalline substance, and the number of the at least one selected from depressions and protrusions is greater than the number of crystals of the polycrystalline substance being in contact with the interface in which the at least one selected from depressions and protrusions exists.

11. The method of driving a non-volatile memory according to claim 1, wherein the layer contains at least one selected from $Pr_{1-x}Ca_xMnO_3$, $La_{1-x}Sr_xMnO_3$, $La_{1-x}Ca_xMnO_3$, and $LaCoO_3$, where x is a numerical value satisfying $0<x<1$.

* * * * *